(12) United States Patent
Maruno et al.

(10) Patent No.: US 11,841,401 B2
(45) Date of Patent: Dec. 12, 2023

(54) DIAGNOSTIC DEVICE, DIAGNOSTIC METHOD, DIAGNOSTIC SYSTEM, AND PROGRAM

(71) Applicant: HONDA MOTOR CO., LTD., Tokyo (JP)

(72) Inventors: Naoki Maruno, Wako (JP); Yoshikazu Nishida, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 324 days.

(21) Appl. No.: 17/260,570

(22) PCT Filed: Aug. 9, 2019

(86) PCT No.: PCT/JP2019/031641
§ 371 (c)(1),
(2) Date: Jan. 15, 2021

(87) PCT Pub. No.: WO2020/045059
PCT Pub. Date: Mar. 5, 2020

(65) Prior Publication Data
US 2021/0278473 A1    Sep. 9, 2021

(30) Foreign Application Priority Data
Aug. 28, 2018   (JP) .................................. 2018-159087

(51) Int. Cl.
*G01R 31/392*   (2019.01)
*G01R 31/385*   (2019.01)
(Continued)

(52) U.S. Cl.
CPC ............ *G01R 31/392* (2019.01); *B60L 58/16* (2019.02); *G01R 31/385* (2019.01); *H01M 10/48* (2013.01);
(Continued)

(58) Field of Classification Search
None
See application file for complete search history.

(56) References Cited

U.S. PATENT DOCUMENTS

2009/0326749 A1   12/2009   Uchida
2011/0221400 A1    9/2011   Takizawa et al.
(Continued)

FOREIGN PATENT DOCUMENTS

CN   102204004   9/2011
CN   102484388   5/2012
(Continued)

OTHER PUBLICATIONS

International Search Report and Written Opinion for International Application No. PCT/JP2019/031641 dated Oct. 15, 2019, 8 pages.
(Continued)

*Primary Examiner* — Roy Y Yi
(74) *Attorney, Agent, or Firm* — AMIN, TUROCY & WATSON, LLP

(57) ABSTRACT

A diagnostic device (100) includes: an acquisition unit (101) that acquires first charging information including a first detected value detected by an external charger (200) during charging of a battery mounted in a vehicle (10) and second charging information including a second detected value detected by the vehicle; and a deterioration estimation unit (105) that estimates a deterioration degree that indicates a degree of deterioration of the battery on the basis of the first charging information and the second charging information.

9 Claims, 12 Drawing Sheets

(51) Int. Cl.
  *B60L 58/16* (2019.01)
  *H02J 7/00* (2006.01)
  *H01M 10/48* (2006.01)
  *G07C 5/00* (2006.01)
(52) U.S. Cl.
  CPC .......... *H01M 10/488* (2013.01); *H02J 7/005* (2020.01); *G07C 5/008* (2013.01); *H01M 2220/20* (2013.01)

(56) References Cited

U.S. PATENT DOCUMENTS

| | | | |
|---|---|---|---|
| 2012/0268066 A1 | 10/2012 | Endo et al. | |
| 2012/0313562 A1 | 12/2012 | Murao et al. | |
| 2013/0030739 A1* | 1/2013 | Takahashi | G01R 31/392 702/63 |
| 2013/0076363 A1 | 3/2013 | Takahashi et al. | |
| 2013/0311017 A1 | 11/2013 | Matsunaga et al. | |
| 2014/0244225 A1 | 8/2014 | Balasingam et al. | |
| 2015/0057957 A1 | 2/2015 | Kim | |
| 2016/0084917 A1 | 3/2016 | Nam | |

FOREIGN PATENT DOCUMENTS

| | | |
|---|---|---|
| CN | 102754303 | 10/2012 |
| CN | 102834727 | 12/2012 |
| CN | 103081212 | 5/2013 |
| CN | 105489954 | 4/2016 |
| CN | 105762431 | 7/2016 |
| CN | 107329088 | 11/2017 |
| JP | 2008-083022 | 4/2008 |
| JP | 2011-258337 | 12/2011 |
| JP | 4960022 | 6/2012 |
| JP | 2013-240242 | 11/2013 |
| JP | 2015-027223 | 2/2015 |
| JP | 2015-158416 | 9/2015 |
| JP | 2016-023968 | 2/2016 |
| JP | 2017-195727 | 10/2017 |
| JP | 6207127 | 10/2017 |
| WO | 2011/162014 | 12/2011 |

OTHER PUBLICATIONS

Japanese Office Action for Japanese Patent Application No. 2020-539311 dated Nov. 16, 2021.
Chinese Office Action for Chinese Patent Application No. 201980048882.X dated Sep. 24, 2023.
Dai, et al. "Research and Realization of VRLA Battery Capability Prediction and Activation Technology", Industrial Control Computer, vol. 22, No. 10, Dec. 31, 2009, pp. 1-3.

* cited by examiner

| ERROR ELEMENT | ISOC VALUE |
|---|---|
| OFFSET CURRENT TEMPERATURE CHARACTERISTIC (-40~100°C) | -A~+A |
| OFFSET CURRENT TEMPERATURE CHARACTERISTIC + HYSTERESIS CHARACTERISTIC | -B~+B |
| GAIN TEMPERATURE CHARACTERISTIC(-40~100°C) | -C~+C |
| GAIN ERROR | -D~+D |
| LINEARITY | -E~+E |

# DIAGNOSTIC DEVICE, DIAGNOSTIC METHOD, DIAGNOSTIC SYSTEM, AND PROGRAM

TECHNICAL FIELD

The present invention relates to a diagnostic device, a diagnostic method, a diagnostic system, and a program.

Priority is claimed on Japanese Patent Application No. 2018-159087, filed Aug. 28, 2018, the content of which is incorporated herein by reference.

BACKGROUND ART

Electrically driven vehicles such as electric cars are equipped with a battery that can be secondarily used for a purpose other than driving. As a secondary use for batteries, for example, supply of electric power to a home may be conceived. In order for secondary use of batteries to become widespread, it is necessary to have an objective method for diagnosing a deterioration degree of a battery. As a method of diagnosing a deterioration degree of a battery, there is a method of diagnosing a deterioration degree of a battery by integrating values (e.g., current values) detected by a sensor during charging of the battery.

CITATION LIST

Patent Literature

[Patent Literature 1]
Japanese Patent Publication No. 6207127
[Patent Literature 2]
Japanese Patent Publication No. 4960022

SUMMARY OF INVENTION

Technical Problem

However, a value detected by a sensor depends on the accuracy of the sensor. Accordingly, there are cases in which a deterioration degree of a battery cannot be diagnosed with high accuracy according to the accuracy of a sensor used for detection.

An object of the present invention devised in view of the aforementioned circumstances is to provide a diagnostic device, a diagnostic method, a diagnostic system, and a program which can diagnose a deterioration degree of a battery with higher accuracy.

Solution to Problem

A diagnostic device, a diagnostic method, a diagnostic system, and a program according to the present invention employ the following configurations.

(1): One aspect of the present invention is a diagnostic device including: an acquisition unit configured to acquire first charging information including a first detected value detected by an external charger during charging of a battery mounted in a vehicle and second charging information including a second detected value detected by the vehicle during charging of the battery; and a deterioration estimation unit configured to estimate a deterioration degree indicating a degree of deterioration of the battery on the basis of the first charging information and the second charging information.

(2): In the aspect of (1), the deterioration estimation unit estimates a deterioration degree indicating a degree of deterioration of the battery while switching between the first charging information and the second charging information.

(3): In the aspect of (2), the first charging information further includes first error information representing error characteristics of the first detected value, the second charging information further includes second error information representing error characteristics of the second detected value, the diagnostic device further includes an error calculation unit configured to calculate a first error representing an error in the first detected value on the basis of the first detected value and the first error information and calculate a second error representing an error in the second detected value on the basis of the second detected value and the second error information, and the deterioration estimation unit estimates the deterioration degree on the basis of the first error and the second error.

(4): In the aspect of (3), the diagnostic device further includes a comparison unit configured to compare the first error with the second error, and the deterioration estimation unit estimates the deterioration degree on the basis of a result of the comparison.

(5): In the aspect of (4), the deterioration estimation unit integrates the second detected value in a period in which the first error is greater than the second error, integrates the first detected value in a period in which the first error is equal to or less than the second error, and estimates a deterioration degree by combining the integrated first detected value and the integrated second detected value.

(6): In the aspect of any one of (1) to (5), the diagnostic device further includes a display unit configured to display the deterioration degree.

(7): In the aspect of any one of (1) to (6), the first detected value and the second detected value are current values.

(8): In the aspect of (7), the deterioration estimation unit estimates the deterioration degree by integrating the first detected value or the second detected value.

(9): One aspect of the present invention is a diagnostic system including: the diagnostic device according to the aspect of any one of (1) to (6); and an external charger configured to communicate with the diagnostic device and transmit first charging information including a first detected value detected during charging of a battery mounted in a vehicle to the diagnostic device.

(10): One aspect of the present invention is a diagnostic method executed using a computer, including: acquiring first charging information including a first detected value detected by an external charger during charging of a battery mounted in a vehicle and second charging information including a second detected value detected by the vehicle during charging of the battery; and estimating a deterioration degree indicating a degree of deterioration of the battery on the basis of the first charging information and the second charging information.

(11): One aspect of the present invention is a program causing a computer to: acquire first charging information including a first detected value detected by an external charger during charging of a battery mounted in a vehicle and second charging information including a second detected value detected by the vehicle during charging of the battery; and estimate a deterioration degree indicating a degree of deterioration of the battery on the basis of the first charging information and the second charging information.

Advantageous Effects

According to (1) to (11), a deterioration degree of a battery can be diagnosed with higher accuracy.

DESCRIPTION OF EMBODIMENTS

Hereinafter, embodiments of a diagnostic device, a diagnostic method, and a program of the present invention will be described with reference to the drawings. In the following description, although a vehicle 10 is an electric car, the vehicle 10 may be any of a vehicle equipped with a secondary battery that supplies electric power for driving, a hybrid vehicle or a fuel cell vehicle.

First Embodiment

[Overall Configuration]

Figure 1:
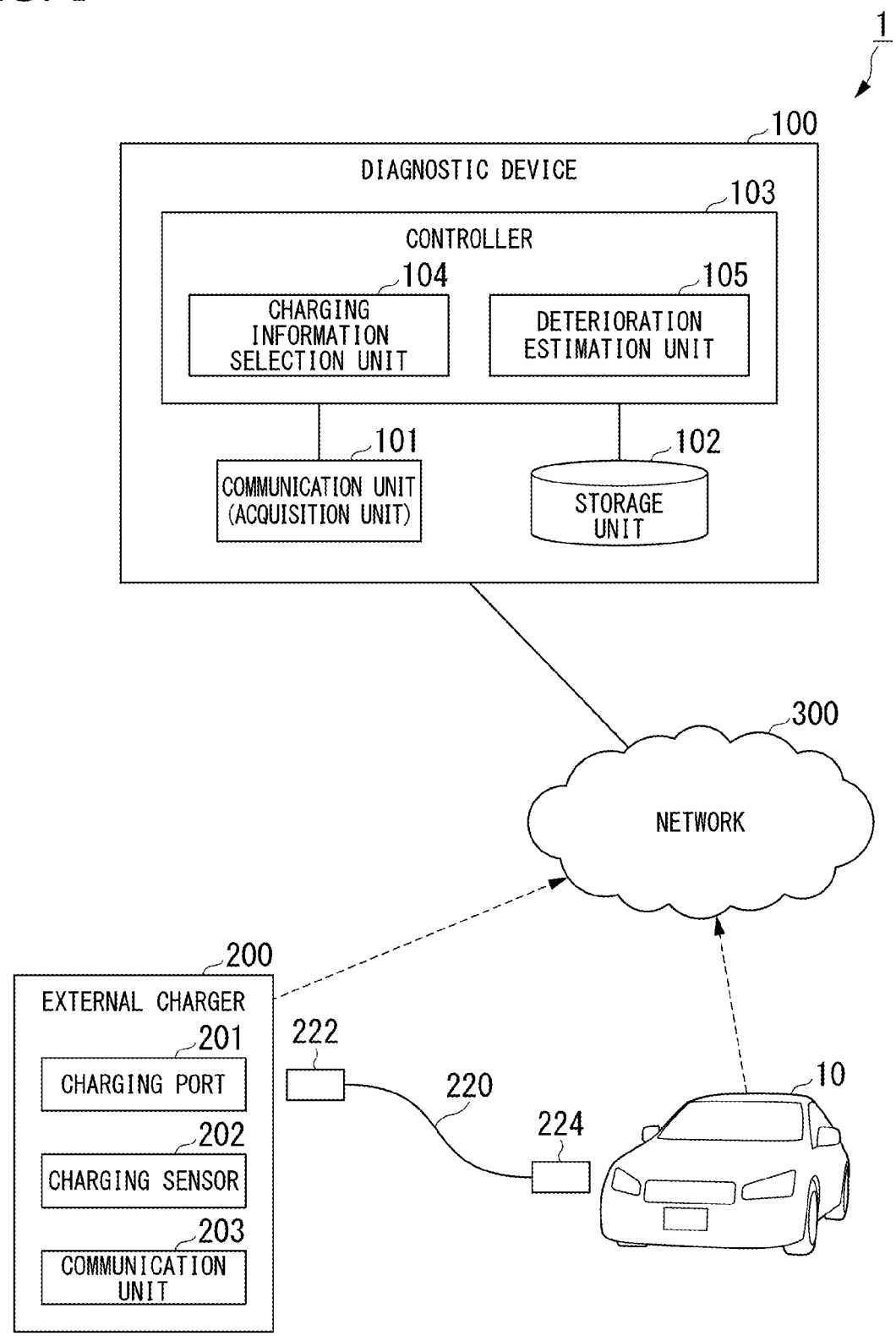
FIG. 1 is a diagram illustrating a configuration example of a diagnostic system 1 according to a first embodiment.

FIG. 1 is a diagram illustrating a configuration example of a diagnostic system 1 according to a first embodiment. The diagnostic system 1 is a battery deterioration diagnostic system that diagnoses deterioration of a battery (hereinafter regarded as having the same meaning as a secondary battery) mounted in the vehicle 10. As illustrated in FIG. 1, the diagnostic system 1 includes the vehicle 10, a diagnostic device 100, and an external charger 200. The vehicle 10, the diagnostic device 100, and the external charger 200 are connected such that they can communicate through a network 300. The network 300 may include, for example, the Internet, a wide area network (WAN), a local area network (LAN), a provider device, a wireless base station, and the like.

[Vehicle 10]

Figure 2:
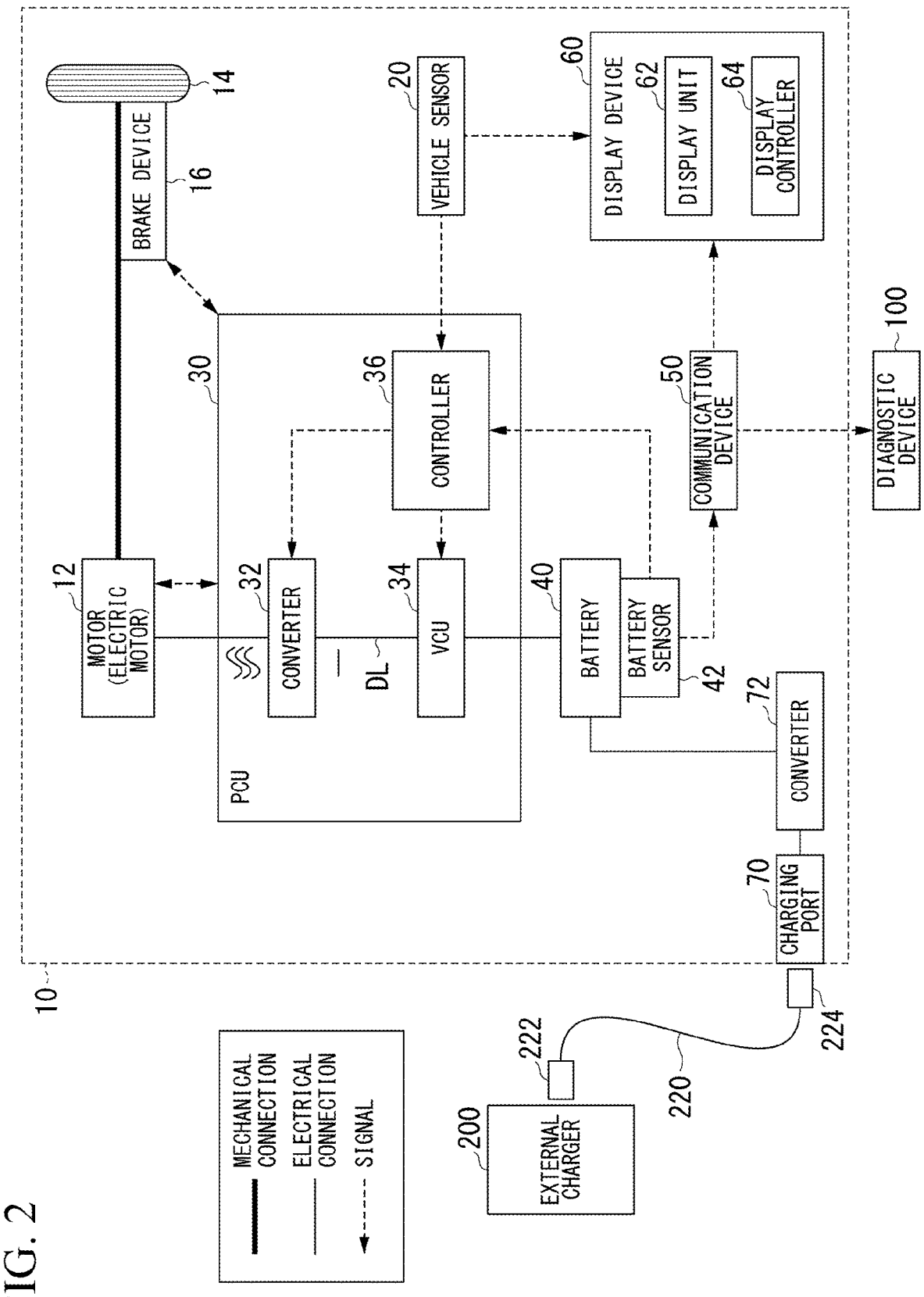
FIG. 2 is a diagram illustrating an example of a configuration of a vehicle 10 according to the first embodiment.

First, the vehicle 10 will be described. FIG. 2 is a diagram illustrating an example of a configuration of the vehicle 10 according to the first embodiment. As illustrated in FIG. 2, the vehicle 10 may include, for example, a motor 12, a driving wheel 14, a brake device 16, a vehicle sensor 20, a power control unit (PCU) 30, a battery 40, a battery sensor 42 such as a voltage sensor, a current sensor, and a temperature sensor, a communication device 50, a display device 60, a charging port 70, and a converter 72.

The motor 12 may be, for example, a three-phase AC motor. A rotor of the motor 12 is connected to the driving wheel 14. The motor 12 outputs power to the driving wheel 14 using electric power supplied thereto. In addition, the motor 12 generates electric power using the kinetic energy of the vehicle when the speed of the vehicle is reduced.

The brake device 16 may include, for example, a brake caliper, a cylinder that transfers oil pressure to the brake caliper, and an electric motor that generates oil pressure in the cylinder. The brake device 16 may include a mechanism for transferring oil pressure generated by operation of a brake pedal to the cylinder through a master cylinder as a backup. Meanwhile, the brake device 16 is not limited to the above-described configuration and may be an electronically controlled hydraulic brake device that transfers oil pressure of a master cylinder to a cylinder.

The vehicle sensor 20 includes an accelerator opening sensor, a vehicle speed sensor, a brake depressed amount sensor. The accelerator opening sensor is attached to an accelerator pedal that is an example of an operator that receives an acceleration instruction from a driver, detects an operation amount of the accelerator pedal, and outputs the detected operation amount to a controller 36 as an accelerator opening degree. The vehicle speed sensor includes a vehicle wheel speed sensor, and a speed calculator attached to each vehicle wheel, for example, calculates a speed of the vehicle (vehicle speed) by combining vehicle wheel speeds detected by the vehicle wheel speed sensor and outputs the vehicle speed to the controller 36 and the display device 60. The brake depressed amount sensor is attached to a brake pedal, detects an operation amount of the brake pedal and outputs the detected operation amount to the controller 36 as a brake depressed amount.

The PCU 30 may include, for example, a converter 32, a voltage control unit (VCU) 34, and the controller 36. Meanwhile, a configuration in which these components are grouped as the PCU 34 is merely an example and these components may be arranged in a distributed manner.

The converter 32 may be, for example, an AC-DC converter. A DC terminal of the converter 32 is connected to a DC link DL. The battery 40 is connected to the DC link DL through the VCU 34. The converter 32 converts AC generated by the motor 12 into DC and outputs the DC to the DC link DL.

The VCU 34 may be, for example, a DC-DC converter. The VCU 34 boosts electric power supplied from the battery 40 and outputs the boosted electric power to the DL link DL.

The controller 36 may include, for example, a motor controller, a brake controller, and a battery/VCU controller. The motor controller, the brake controller, and the battery/VCU controller may be replaced with separate control devices, for example, control devices such as a motor ECU, a brake ECU, and a battery ECU.

The motor controller controls the motor 12 on the basis of the output of the vehicle sensor 20. The brake controller controls the brake device 16 on the basis of the output of the vehicle sensor 20. The battery/VCU controller calculates a state of charge (SOC; hereafter referred to as "battery charge rate") of the battery 40 on the basis of the output of the battery sensor 42 attached to the battery 40 and outputs the SOC to the VCU 34 and the display device 60. The VCU 34 increases the voltage of the DC link DL in response to an instruction from the battery/VCU controller.

The battery 40 may be, for example, a secondary battery such as a lithium-ion battery. The battery 40 accumulates electric power received from the external charger 200 and performs discharging for driving of the vehicle 10.

The battery sensor 42 may include, for example, sensors such as a current sensor, a voltage sensor, and a temperature sensor. The battery sensor 42 may detect a current value, a voltage value, and a temperature of the battery 40, for example. The battery sensor 42 outputs battery use state information such as the detected current value, voltage value, and temperature to the controller 36. In the first embodiment, the battery sensor 42 detects a current value during charging of the battery 40 as a second current value. The second current value is one aspect of a second detected value. The battery sensor 42 stores second error information representing error characteristics of the second current value detected by the battery sensor 42. The second error information is stored in the battery sensor 42 in advance. The battery sensor 42 outputs information including battery use state information detected during charging of the battery 40, the second error information, and time at which a battery use state is detected to the communication device 50 as charging information. The charging information output from the battery sensor 42 is one aspect of second charging information. The battery sensor 42 may include a plurality of sensors such as current sensors, voltage sensors, and temperature sensors. The battery sensor 42 may include battery sensor identifiers in the battery use state information when a plurality of sensors are included. The battery sensor identifiers are identifiers by which the plurality of sensors included in the vehicle 10 can be identified. The battery sensor identifiers may be represented by predetermined alphanumeric characters.

The communication device 50 includes a wireless module for connecting to a cellular network and a Wi-Fi network.

The communication device 50 acquires the charging information output from the battery sensor 42 during charging of the battery 40 and transmits the charging information to the diagnostic device 100 through the network 300 illustrated in FIG. 1. The communication device 50 may add battery type information and vehicle type information of the host vehicle to the charging information to be transmitted. In addition, the communication device 50 receives information (e.g., a deterioration degree of the battery 40) transmitted from the diagnostic device 100 through the network 300. The communication device 50 outputs the received information to the display device 60.

The display device 60 may include, for example, a display unit 62 and a display controller 64. The display unit 62 displays information according to control of the display controller 64. The display controller 64 causes the display unit 62 to display a degree of battery deterioration, a battery charge rate, or the number of days required to reach a designated deterioration degree in response to information output from the controller 36 and the communication device 50. In addition, the display controller 64 causes the display unit 62 to display a vehicle speed and the like output from the vehicle sensor 20.

The charging port 70 is provided directed the outside of the body of the vehicle 10. The charging port 70 is connected to the external charger 200 through a charging cable 220.

The charging cable 220 includes a first plug 222 and a second plug 224. The first plug 222 is connected to the external charger 200 and the second plug 224 is connected to the charging port 70. Electricity supplied from the external charger 200 is supplied to the charging port 70 through the charging cable 220.

In addition, the charging cable 220 includes a signal cable attached to a power cable. The signal cable mediates communication between the vehicle 10 and the external charger 200. Accordingly, a power connector and a signal connector are respectively provided to the first plug 222 and the second plug 224.

The converter 72 is provided between the charging port 70 and the battery 40. The converter 72 converts current received from the external charger 200 through the charging port 70, for example, AC, into DC. The converter 72 outputs the converted DC to the battery 40.

The vehicle 10 may transmit the charging information at predetermined time intervals, for example, hourly or daily or on the basis of an instruction of a user of the vehicle 10. In addition, the vehicle 10 may transmit the charging information in response to the request of the diagnostic device 100. Further, the vehicle 10 may cause the predetermined conditions to be established when predetermined conditions are established, for example, when the load of the battery 40 exceeds a specific amount or when the amount of increase in the load of the battery 40 from previous transmission has reached a specific amount. In addition, the vehicle 10 may perform transmission of the charging information at a plurality of such timings. The user may be the owner of the vehicle 10 or a person who rents the vehicle 10 by a means such as a rental car.

[Diagnostic Device 100]

Referring back to FIG. 1, the diagnostic device 100 will be described. The diagnostic device 100 is an information processing device such as a personal computer, a server, or the like. The diagnostic device 100 estimates a deterioration degree indicating a degree of deterioration of the battery 40 mounted in the vehicle 10 on the basis of information transmitted from the vehicle 10 and the external charger 200. The vehicle 10 and the diagnostic device 100 communicate through the network 300. The diagnostic device 100 serves as a device including a communication unit 101, a storage unit 102, and a controller 103 by executing a diagnostic program. The diagnostic device 100 performs diagnosis of the battery 40 by estimating a deterioration degree of the battery 40. A deterioration degree is an index indicating a degree to which a charge capacity of a battery when the battery has been fully charged has decreased from a charge capacity of a new battery.

The communication unit (acquisition unit) 101 may be, for example, a network interface such as a network interface card (NIC). The communication unit 101 communicates with the vehicle 10 and the external charger 200 through the network 300. The communication unit 101 acquires respective charging information from the vehicle 10 and the external charger 200. In the first embodiment, the communication unit 101 acquires charging information including a first current value and first error information from the external charger 200 by communicating with the external charger 200. The first current value is a current value detected by a charging sensor 202 included in the external charger 200 during charging of the battery 40 mounted in the vehicle 10. The first error information represents error characteristics of the first current value detected by the charging sensor 202. The communication unit 101 acquires charging information including a second current value and second error information by communicating with the vehicle 10. The communication unit 101 may perform communication through a communication scheme such as a wireless LAN, a wired LAN, Bluetooth (registered trademark), or Long Term Evolution (LTE) (registered trademark).

The storage unit 102 is configured using a storage device such as a magnetic hard disk or a semiconductor storage device. The storage unit 102 stores pieces of acquired charging information in association with each other. The charging information recorded in the storage unit 102 is used to estimate a deterioration degree of the battery 40.

The controller 103 controls the operation of each part of the diagnostic device 100. The controller 103 may be realized, for example, by a hardware processor such as a central processing unit (CPU) executing a program (software). Some or all components may be realized by hardware (circuit part including a circuitry) such as a large scale integration (LSI) circuit, an application specific integrated circuit (ASIC), a field-programmable gate array (FPGA), or a graphics processing unit (GPU) or by software and hardware in cooperation. The program may be stored in advance in a storage device (non-transitory storage medium) such as a hard disk drive (HDD) or a flash memory or stored in a separable storage medium (non-transitory storage medium) such as a DVD or a CD-ROM and installed when the storage medium is installed in a drive device.

The controller 103 serves as a charging information selection unit 104 and a deterioration estimation unit 105 by executing a program.

The charging information selection unit 104 selects charging information used to estimate a deterioration degree of the battery 40 between the charging information acquired from the vehicle 10 and the charging information acquired from the external charger 200. The charging information selection unit 104 outputs the selected charging information to the deterioration estimation unit 105. The charging information selection unit 104 outputs the charging information to the deterioration estimation unit 105 while switching between the charging information acquired from the vehicle 10 and the charging information acquired from the external charger 200 in response to the acquired charging information. The charging information selection unit 104 records the selected charging information in the storage unit 102. Detailed processing in the charging information selection unit 104 will be described later.

The deterioration estimation unit 105 estimates a deterioration degree of the battery 40. For example, the deterioration estimation unit 105 estimates a deterioration degree of the battery 40 while switching between the charging information acquired from the vehicle 10 and the charging information acquired from the external charger 200 output from the charging information selection unit 104.

A deterioration degree of the battery 40 may be, for example, a battery capacity. The deterioration estimation unit 105 estimates a deterioration degree of the battery 40 using a known method. The known method may be, for example, a current integration method of integrating a current value included in charging information with the elapse of time. The deterioration estimation unit 105 may calculate a resistance value from a current value or a voltage value included in charging information using a sequential least squares method. The deterioration estimation unit 105 may estimate a battery capacity from $\Delta Ah/\Delta SOC$ by predicting a SOC on the basis of the calculated resistance value. The deterioration estimation unit 105 calculates a deterioration degree of the battery 40 by dividing the estimated battery capacity by a battery capacity in a state in which the battery 40 is not deteriorated. The deterioration estimation unit 105 may transmit the estimated deterioration degree of the battery 40 to the vehicle 10. In this case, the deterioration degree of the battery 40 may be displayed on the display unit 62 of the vehicle 10. In addition, the deterioration estimation unit 105 may be configured to estimate a deterioration degree of the battery 40 using a known method for one or more pieces of charging information recorded in the storage unit 102.

[External Charger 200]

The external charger 200 charges the battery 40 mounted in the vehicle 10 by supplying electricity to the vehicle 10. The external charger 200 includes a charging port 201, the charging sensor 202, and a communication unit 203.

The charging sensor 202 may include sensors such as a current sensor, a voltage sensor, and a temperature sensor, for example. The charging sensor 202 may detect a current value, a voltage value, and a temperature when the battery 40 mounted in the vehicle 10 is charged, for example. In the first embodiment, the charging sensor 202 detects a current value during charging of the battery 40 as the first current value. The first current value is one aspect of a first detected value. The charging sensor 202 stores the first error information representing error characteristics of the first current value detected by the charging sensor 202. The first error information is stored in the charging sensor 202 in advance. The charging sensor 202 outputs information including the first current value detected during charging of the battery 40, the first error information, and a time at which the first current value is detected to the communication unit 203 as charging information. The charging information detected by the charging sensor 202 is one aspect of first charging information. The charging sensor 202 may include a plurality of sensors such as current sensors, voltage sensors and temperature sensors. If the charging sensor 202 includes a plurality of sensors, the charging sensor 202 may include charging sensor identifiers in the charging information. Charging sensor identifiers are identifiers by which a plurality of sensors included in the external charger 200 can be identified. Charging sensor identifiers may be represented as predetermined alphanumeric characters, for example.

The communication unit 203 is a network interface. The communication unit 203 communicates with the diagnostic device 100 through the network 300. The communication unit 203 acquires the charging information from the charging sensor 202. The communication unit 203 transmits the acquired charging information to the diagnostic device 100. The communication unit 203 may perform communication through a communication scheme such as a wireless LAN, a wired LAN, Bluetooth, or LTE, for example.

Figure 3:
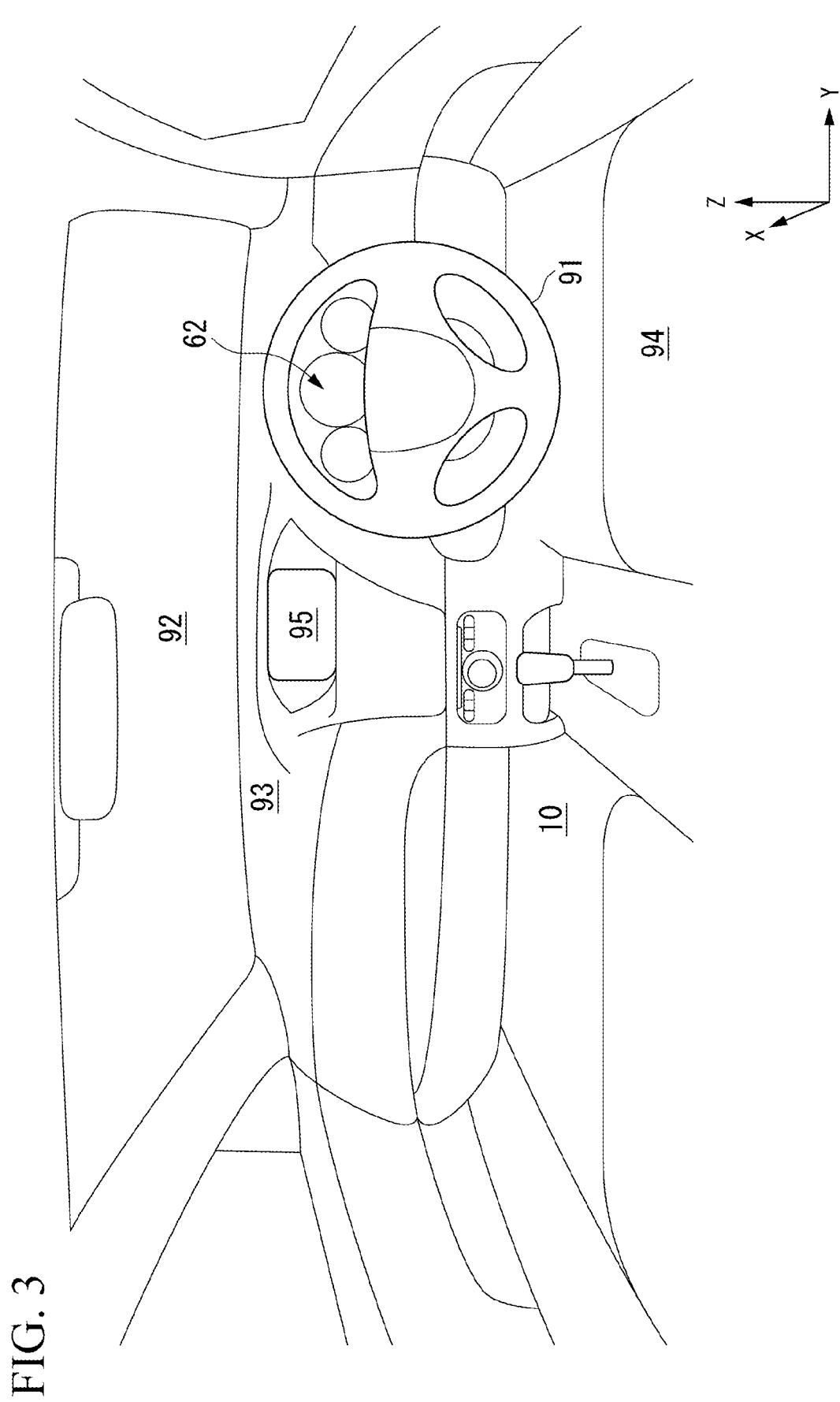
FIG. 3 is a diagram exemplifying a configuration of a vehicle cabin of the vehicle 10.

FIG. 3 is a diagram exemplifying a configuration of a vehicle cabin of the vehicle 10. As illustrated in FIG. 3, the vehicle 10 may be provided with, for example, a steering wheel 91 that controls steering of the vehicle 10, a front windshield 92 that separates the outside of the vehicle and the inside of the vehicle from each other, and an instrument panel 93. The front windshield 92 is a light-transmitting member.

In addition, the display unit 62 of the display device 60 is provided in the instrument panel 93 in the vehicle cabin near the front of a driver's seat 94. The display unit 62 can be visibly recognized by a driver through a gap in the steering wheel 91 or over the steering wheel 91. Further, a second display device 95 is provided at the center of the instrument panel 93. For example, the second display device 95 may display images corresponding to navigation processing executed by a navigation device (not shown) mounted in the vehicle 10 or display a video and the like of the other party of a video call. In addition, the second display device 95 may display a TV program, play a DVD, or display content of a downloaded movie or the like.

Figures 4, 5:
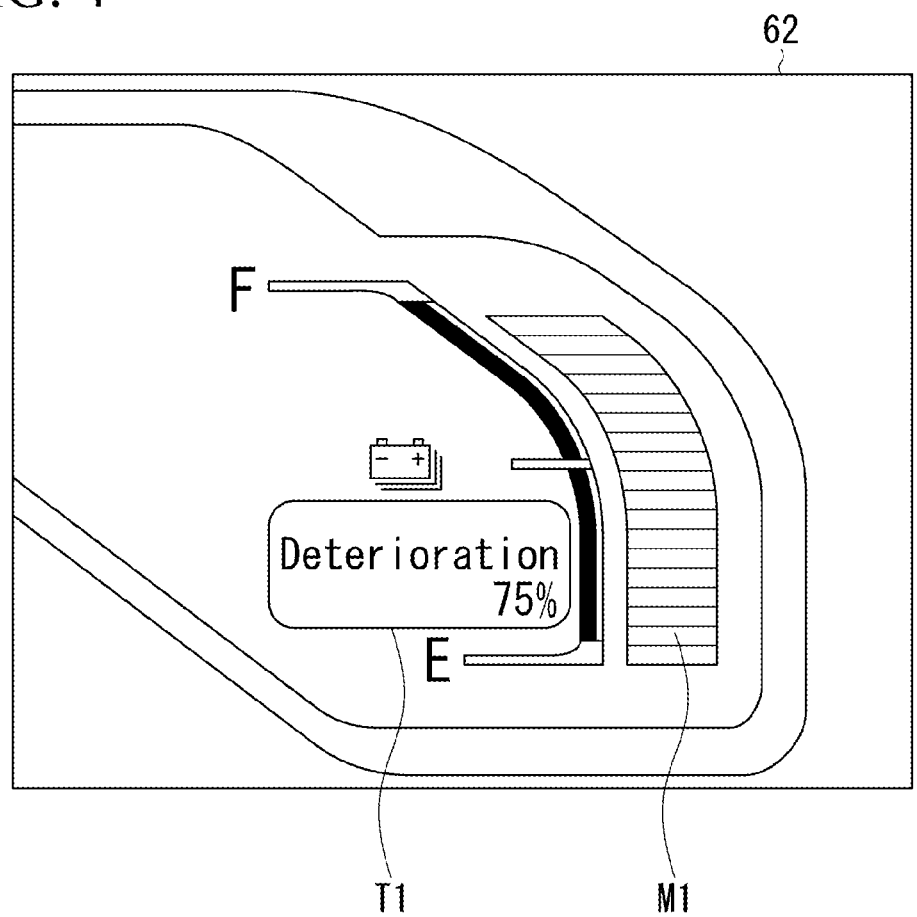
FIG. 4 is a diagram illustrating an example of a screen displayed on a display unit 62.
FIG. 5 is a diagram illustrating a specific example of error elements and ISOC values representing error characteristics of a current sensor.

FIG. 4 is a diagram illustrating an example of a screen displayed on the display unit 62. As illustrated in FIG. 4, for example, a deterioration degree T1 of the battery 40 and a battery charge rate meter M1 are displayed on the display unit 62. The deterioration degree T1 of the battery is represented by numerals and the battery charge rate meter M1 is represented by a meter. In the example illustrated in FIG. 4, the deterioration degree T1 of the battery 40 is displayed as 75% and the battery charge rate meter M1 is displayed as about 90%. Meanwhile, the display device 60 may cause the display unit 62 to display information other than the deterioration degree T1 of the battery 40 and the battery charge rate meter M1, for example, the number of days required to reach a designated deterioration degree or a designated deterioration degree. In this case, the diagnostic device 100 may be configured to transmit the number of days required to reach a designated deterioration degree or the designated deterioration degree to the vehicle 10.

FIG. 5 is a diagram illustrating a specific example of error elements and ISOC values representing error characteristics of a current sensor. The error elements and the ISOC values represent specific elements and values of the first error information or the second error information. Referring to FIG. 5, the error elements include an offset current temperature characteristic, an offset current temperature characteristic+hysteresis characteristic (combined characteristic of offset current temperature characteristic and hysteresis characteristic), a gain temperature characteristic, a gain error, and a linearity. Referring to FIG. 5, an ISOC value of the offset current temperature characteristic is −A to +A. An ISOC value of the offset current temperature characteristic+ hysteresis characteristic is −B to +B. An ISOC value of the gain temperature characteristic is −C to +C. An ISOC value of the gain error is −D to +D. An ISOC value of the linearity is −E to +E. The charging information selection unit 104 calculates an offset temperature characteristic error, a hysteresis characteristic error, a gain temperature characteristic error, and a linearity error on the basis of the error elements. The ISOC values of the error elements are defined in specifications of the current sensor. Accordingly, the charging information selection unit 104 may calculate errors using error elements other than the aforementioned ones if the error elements are defined in the specifications of the current sensor.

Figure 6:
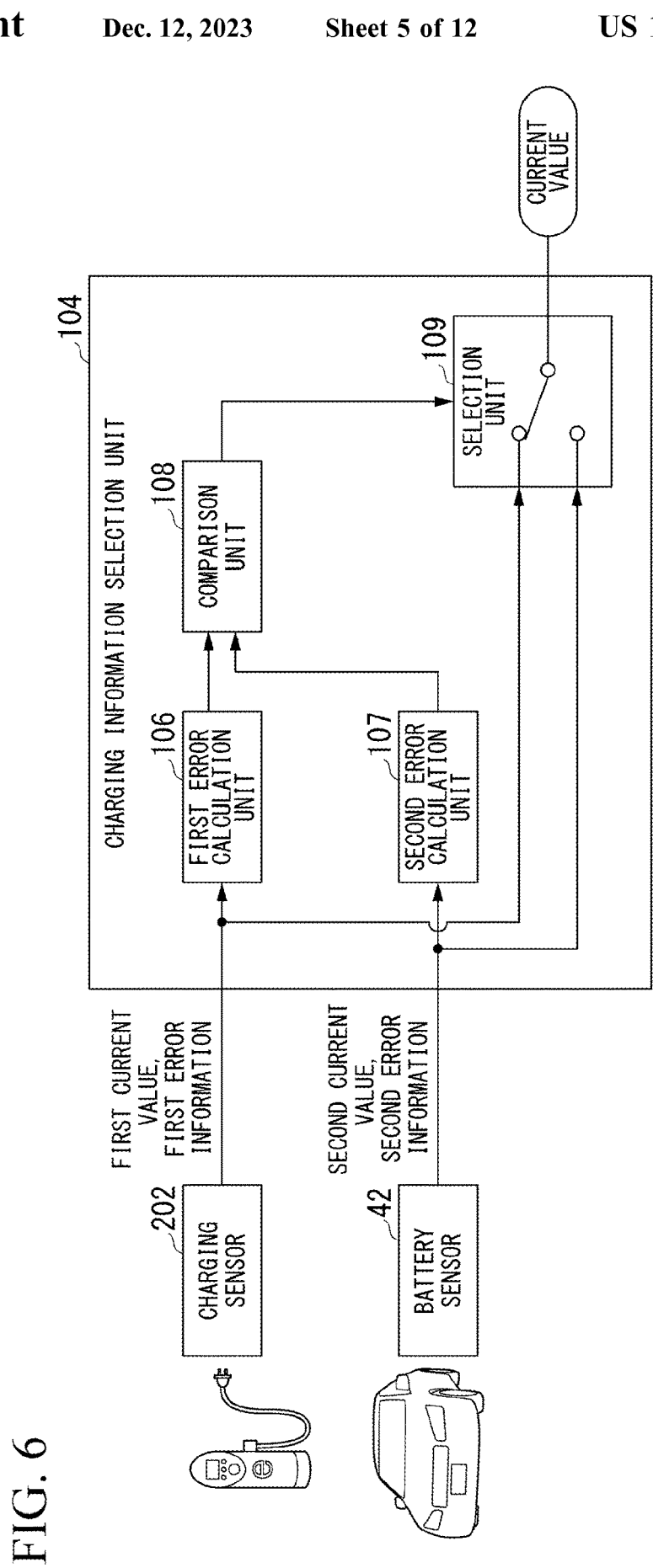
FIG. 6 is a block diagram illustrating a specific example of processing of a charging information selection unit 104.

FIG. 6 is a block diagram illustrating a specific example of processing of the charging information selection unit 104. The charging information selection unit 104 includes a first error calculation unit 106, a second error calculation unit 107, a comparison unit 108, and a selection unit 109. The charging information selection unit 104 acquires charging information including the first current value and the first error information from the charging sensor 202 through the communication unit 101. The charging information selection unit 104 acquires charging information including the second current value and the second error information from the battery sensor 42 through the communication unit 101.

The first error calculation unit 106 calculates a first total error on the basis of the first current value and the first error information included in the charging information acquired from the charging sensor 202. The first total error represents an error with respect to a true value of the first current value. The first total error is one aspect of a first error. Specifically, the first error calculation unit 106 calculates offset errors $I_{offset}$ of each current sensor included in the charging sensor 202 on the basis of the first current value, and error elements and ISOC values included in the first error information. The first error calculation unit 106 calculates an average value $\mu_{offset}$ of the offset errors of each current sensor. The first error calculation unit 106 calculates a standard deviation $\sigma_{offset}$ of the offset errors of each current sensor.

The first error calculation unit 106 calculates hysteresis errors $I_{hys}$ of each current value on the basis of the first current value, and the error elements and the ISOC values included in the first error information. The first error calculation unit 106 calculates an average value $\mu_{hys}$ of the hysteresis errors $I_{hys}$ of each current value. The first error calculation unit 106 calculates a standard deviation $\sigma_{hys}$ of the hysteresis errors $I_{hys}$ of each current value.

The first error calculation unit 106 calculates gain temperature characteristic errors $G_{gain}$ of each current value on the basis of the first current value, and the error elements and the ISOC values included in the first error information. The first error calculation unit 106 calculates an average value $\mu_{gain}$ of the gain temperature characteristic errors $G_{gain}$ of each current value. The first error calculation unit 106 calculates a standard deviation $\sigma_{gain}$ of the gain temperature characteristic errors $G_{gain}$ of each current value.

The first error calculation unit 106 calculates linearity errors $G_{linear}$ of each current value on the basis of the first current value, and the error elements and the ISOC values included in the first error information. The first error calculation unit 106 calculates an average value $\mu_{linear}$ of the linearity errors $G_{linear}$ of each current value. The first error calculation unit 106 calculates a standard deviation $\sigma_{linear}$ of the linearity errors $G_{linear}$ of each current value.

Subsequently, the first error calculation unit 106 calculates the first total error $I_{error\_total}$ on the basis of the calculated average values of the errors and the standard deviations of the errors. The first error calculation unit 106 outputs the calculated first total error $I_{error\_total}$ to the comparison unit 108. The first error calculation unit 106 is one aspect of an error calculation unit.

The second error calculation unit 107 calculates a second total error on the basis of the second current value and the second error information included in the charging information acquired from the battery sensor 42. The second total error represents an error with respect to a true value of the second current value. The second total error is one aspect of a second error. Specifically, the second error calculation unit 107 calculates offset errors $I_{offset}$ of each current sensor included in the battery sensor 42, an average value $\mu_{offset}$ of the offset errors of each current sensor, a standard deviation offset of the offset errors of each current sensor, hysteresis errors $I_{hys}$ of each current value, an average value $\mu_{hys}$ of the hysteresis errors of each current value, a standard deviation $\sigma_{hys}$ of the hysteresis errors of each current value, gain temperature characteristic errors $G_{gain}$ of each current value, an average value μgain of the gain temperature characteristic errors of each current value, a standard deviation $\sigma_{gain}$ of the gain temperature characteristic errors of each current value, linearity errors $G_{linear}$ of each current value, an average value $\mu_{linear}$ of the linearity errors of each current value, and a standard deviation $\sigma_{linear}$ of the linearity errors of each current value on the basis of the second current value, and error elements and ISOC values included in the second error information using the same means as the first error calculation unit 106.

Subsequently, the second error calculation unit 107 calculates the second total error $I_{error\_total}$ on the basis of the calculated average values of the errors and standard deviations of the errors. The second error calculation unit 107 outputs the calculated second total error $I_{error\_total}$ to the comparison unit 108. The second error calculation unit 107 is one aspect of an error calculation unit. The error calculation unit may have the functions of the first error calculation unit 106 and the second error calculation unit 107.

Meanwhile, a current sensor included in the charging sensor 202 and a current sensor included in the battery sensor 42 are independent parts. Accordingly, a function $y=f(x_1, x_2, \ldots, x_n)$ composed of independent $x_i$ is conceived. Here, there is a variation in $x_i$. When a standard deviation with respect to $x_i$ is $\sigma_{xi}$, a standard deviation $\sigma_y$ of the function $y=f(x_1, x_2, \ldots, x_n)$ is represented by the following mathematical expression (1). The standard deviation $\sigma_y$ represented by Mathematical expression (1) represents the standard deviations ($\sigma_{offset}$, $\sigma_{hys}$, $\sigma_{gain}$, $\sigma_{linear}$) of the errors calculated by the first error calculation unit 106 or the second error calculation unit 107.

[Math. 1]

$$\sigma_y = \sqrt{\left(\frac{\partial f}{\partial x_1}\sigma_{x1}\right)^2 + \left(\frac{\partial f}{\partial x_2}\sigma_{x2}\right)^2 + \ldots + \left(\frac{\partial f}{\partial x_n}\sigma_{xn}\right)^2} \quad (1)$$

The first total error calculated by the first error calculation unit 106 or the second total error calculated by the second error calculation unit 107 is represented by the following mathematical expression (2). Both the first total error and the second total error are calculated by Mathematical expression (2).

[Math. 2]

$$I_{error\_total} = \mu_{offset} + \mu_{sys} + \mu_{gain} + \mu_{linear} \pm \sqrt{(\sigma_{offset})^2 + (\sigma_{sys})^2 + (\sigma_{gain})^2 + (\mu_{linear})^2} \quad (2)$$

The comparison unit 108 compares the first total error with the second total error. The comparison unit 108 outputs a comparison result to the selection unit 109. For example, the comparison unit 108 may compare whether the first total error is greater than the second total error. The comparison unit 108 outputs a signal representing that the first total error is greater than the second total error to the selection unit 109 as a comparison result when the first total error is greater than the second total error. The comparison unit 108 outputs a signal representing that the first total error is equal to or less than the second total error to the selection unit 109 as a comparison result when the first total error is equal to or less than the second total error. That is, the comparison unit 108 outputs the signal representing that the first total error is greater than the second total error to the selection unit 109 in a period in which the first total error is greater than the second total error during charging of the battery 40. The comparison unit 108 outputs the signal representing that the first total error is equal to or less than the second total error to the selection unit 109 in a period in which the first total error is equal to or less than the second total error during charging of the battery 40.

The selection unit 109 selects a current value output to the deterioration estimation unit 105 on the basis of the comparison result, the first current value, and the second current value. Specifically, when the signal representing that the first total error is greater than the second total error is received from the comparison unit 108, the selection unit 109 selects the second current value as a current value output to the deterioration estimation unit 105. When a signal representing that the second total error is larger is received from the comparison unit 108, the selection unit 109 selects the first current value as a current value output to the deterioration estimation unit 105. The selection unit 109 outputs the first current value and the second current value to the deterioration estimation unit 105 while switching between the first current value and the second current value in response to a signal representing a comparison result output from the comparison unit 108. In addition, the charging information selection unit 104 records charging information in the storage unit 102 while switching the charging information in response to a signal representing a comparison result output from the comparison unit 108.

Figure 7:
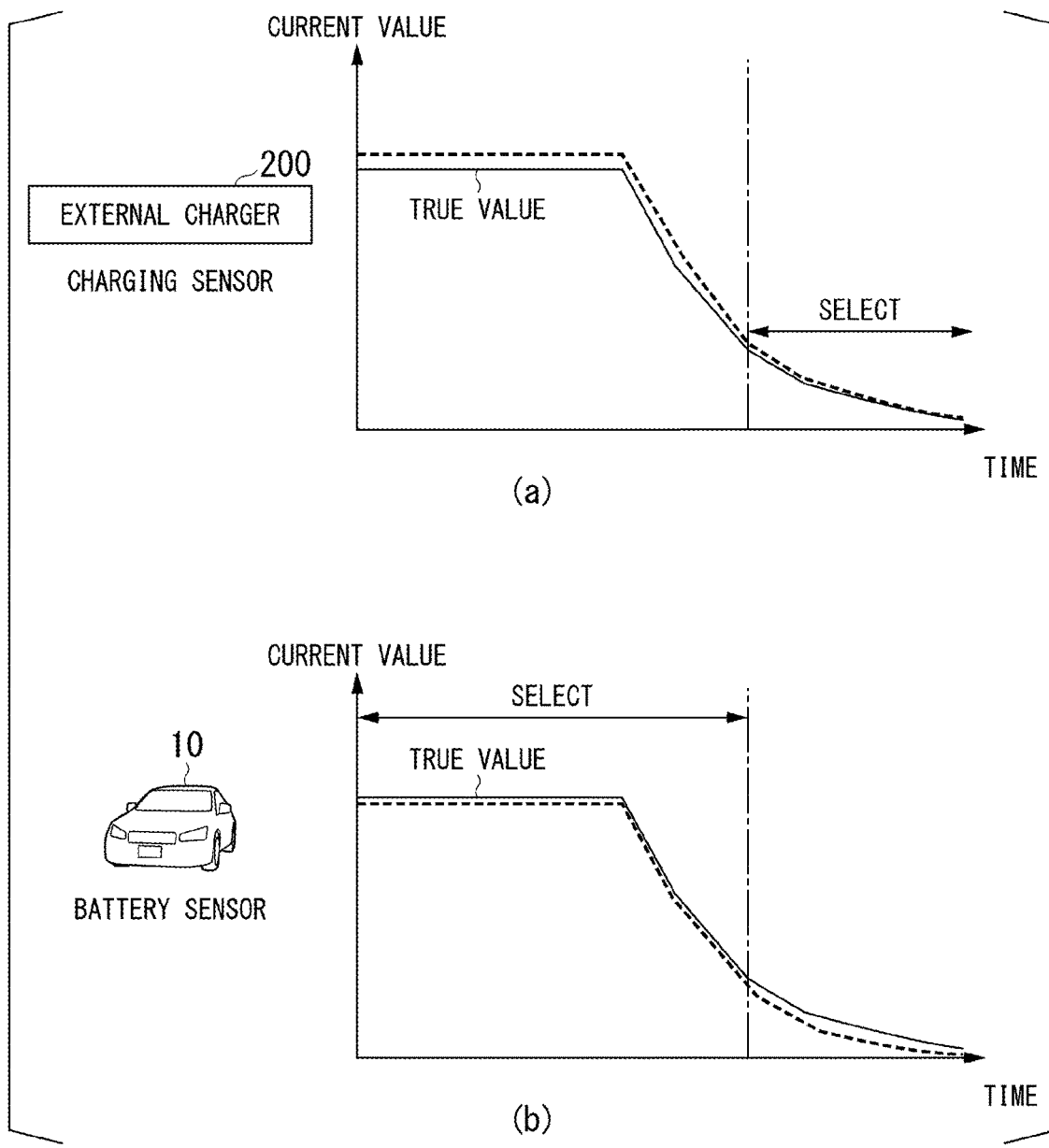
FIG. 7 is a graph showing change with time in a current value detected by a current sensor.

FIG. 7 is a graph showing change with time in a current value detected by a current sensor. FIG. 7(a) is a diagram illustrating change with time in the first current value detected by the charging sensor 202 mounted in the external charger 200. FIG. 7(b) is a diagram illustrating change with time in the second current value detected by the battery sensor 42 mounted in the vehicle 10. The horizontal axis of FIG. 7 represents time. The vertical axis of FIG. 7 represents a current value. Referring to FIG. 7, the charging sensor 202 and the battery sensor 42 detect specific current values until a predetermined condition is satisfied after charging starts. When the predetermined condition is satisfied, detected current values decrease with the elapse of time. The predetermined condition may be, for example, a condition in which a charge rate of the battery 40 has exceeded a predetermined charge rate or a predetermined time has elapsed. Solid lines represented in the graphs of FIG. 7(a) and FIG. 7(b) indicate current values detected by current sensors. Dotted lines represented in FIG. 7(a) and FIG. 7(b) indicate true values of current values. A true value of a current value in the graph of FIG. 7(a) is obtained by subtracting the first total error from the first current value. A true value of a current value in the graph of FIG. 7(b) is obtained by subtracting the second total error from the second current value.

Referring to FIG. 7, when charging starts, the selection unit 109 selects the second current value detected by the battery sensor 42. On the other hand, the selection unit 109 selects the first current value detected by the charging sensor 202 when the charge rate of the battery 40 is close to full charging and a detected current value decreases. This is because the current sensor of the charging sensor 202 has higher resolution and can measure a current value in more detail than the battery sensor 42.

Figure 8:
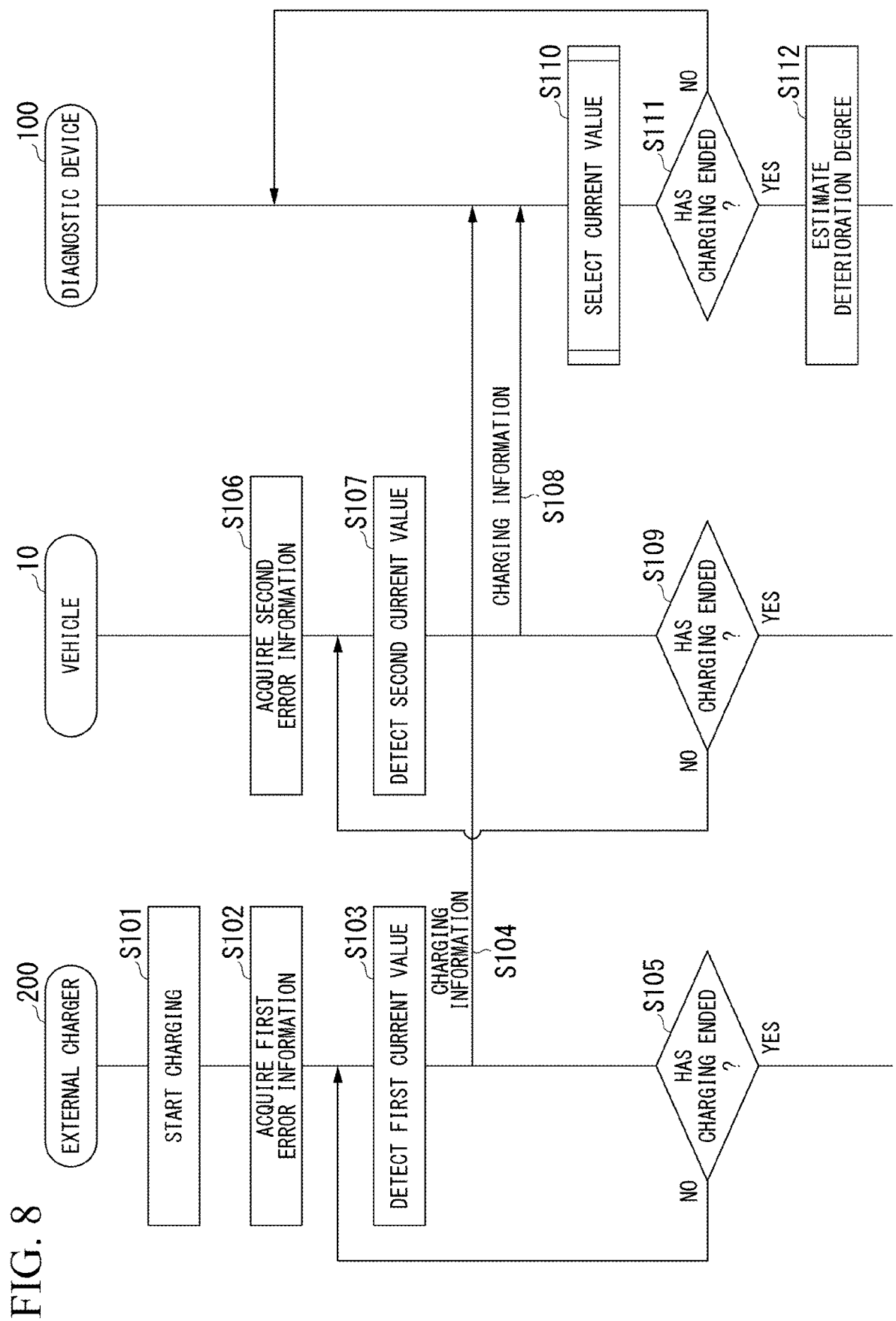
FIG. 8 is a sequence chart illustrating a flow of processing of estimating a deterioration degree according to the first embodiment.

FIG. 8 is a sequence chart illustrating a flow of processing of estimating a deterioration degree according to the first embodiment. In FIG. 8, it is assumed that charging information includes a current value. Meanwhile, step S102 to step S105 and step S106 to step S109 are performed in parallel. Step S106 starts after step S101 is performed.

First, the external charger 200 starts charging of the battery 40 mounted in the vehicle 10 (step S101). The charging sensor 202 acquires the first error information recorded by the charging sensor 202 (step S102). The charging sensor 202 detects the first current value from charging current with respect to the battery 40 (step S103). The charging sensor 202 transmits charging information including the first error information, the first current value, and a time when the first current value is detected to the diagnostic device 100 through the communication unit 203 (step S104).

The external charger 200 determines whether charging has ended (step S105). Whether charging has ended may be determined, for example, by determining whether the first plug 222 has been separated from the charging port 201 or determining whether a charge rate of the battery 40 has reached a predetermined threshold value (e.g., 95%) or more. When charging has ended (step S105: YES), the external charger 200 ends transmission of the charging information to the diagnostic device 100. When charging has not ended (step S105: NO), processing proceeds to step S103.

The battery sensor 42 acquires the second error information recorded by the battery sensor 42 (step S106). The battery sensor 42 detects the second current value from charging current with respect to the battery 40 (step S107). The communication device 50 transmits charging information including the second error information, the second current value, and a time when the second current value is detected to the diagnostic device 100 (step S108).

The battery sensor 42 determines whether charging has ended (step S109). Whether charging has ended may be determined, for example, by determining whether the second plug 224 has been separated from the charging port 70 or determining whether a charge rate of the battery 40 has reached a predetermined threshold value (e.g., 95%) or more. When charging has ended (step S109: YES), the battery sensor 42 ends transmission of the charging information to the diagnostic device 100. When charging has not ended (step S109: NO), processing proceeds to step S107.

The communication unit 101 outputs the transmitted charging information to the charging information selection unit 104. The charging information selection unit 104 selects a current value for estimating a deterioration degree of the battery 40 on the basis of the charging information (step S110). Selection of a current value will be described later. The charging information selection unit 104 determines whether charging has ended (step S111). Whether charging has ended may be determined, for example, by determining whether a charging completion notification has been received from the external charger 200 or the vehicle 10 or determining whether a charge rate of the battery 40 has reached a predetermined threshold value (e.g., 95%) or more.

When charging of the battery 40 has ended (step S111: YES), the deterioration estimation unit 105 estimates a deterioration degree of the battery 40 (step S112). For example, when a deterioration degree is estimated using a current integration method, the deterioration estimation unit 105 estimates a deterioration degree by integrating the second current value in a period in which the first total error is greater than the second total error, integrating the first current value in a period in which the first total error is equal to or less than the second total error, and combining the integrated first current value and second current value. When charging has not ended (step S111: NO), processing with respect to the external charger 200 proceeds to step S110 in the diagnostic device 100.

Figure 9:
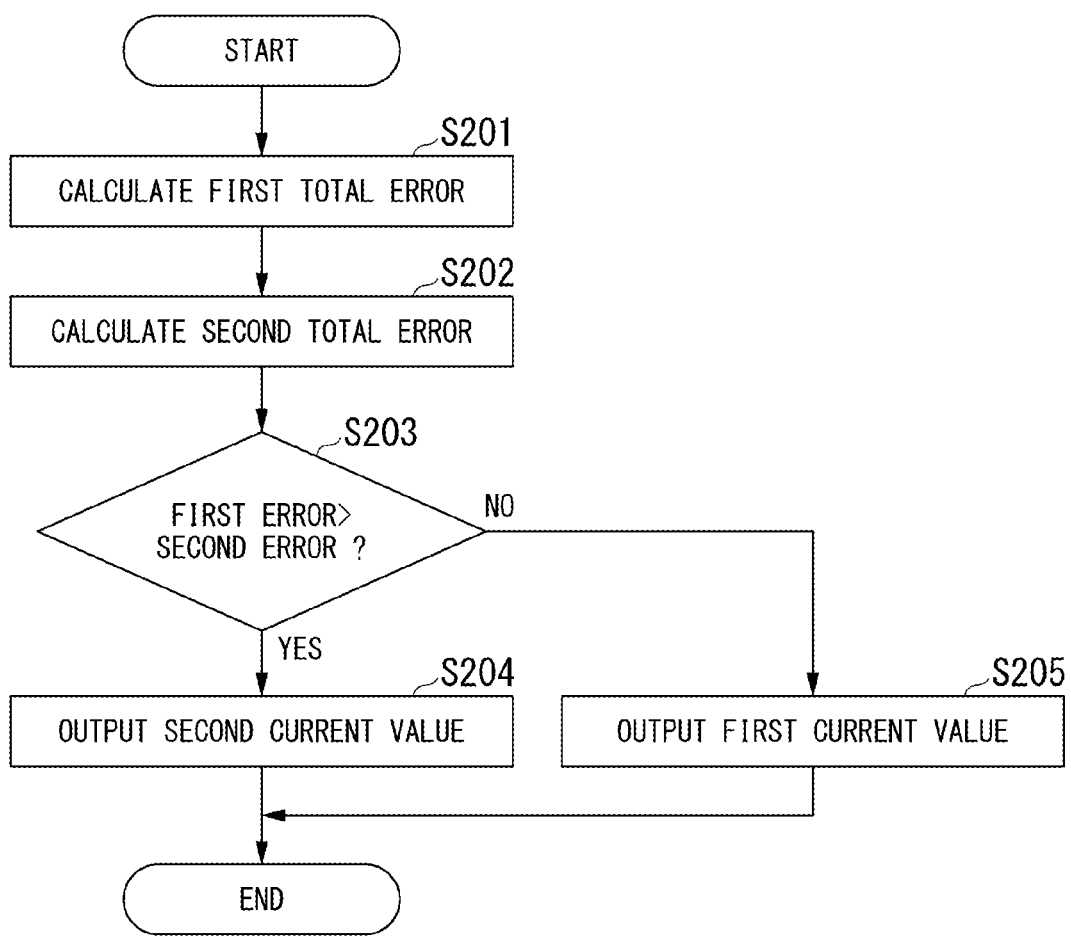
FIG. 9 is a flowchart illustrating a flow of processing of selecting a current value according to the first embodiment.

FIG. 9 is a flowchart illustrating a flow of processing of selecting a current value according to the first embodiment.

In FIG. 9, it is assumed that charging information includes a current value. The first error calculation unit 106 of the charging information selection unit 104 calculates the first total error on the basis of the first current value and the first error information included in the charging information acquired from the charging sensor 202 (step S201). The first total error is calculated on the basis of Mathematical expression (1) and Mathematical expression (2). The second error calculation unit 107 of the charging information selection unit 104 calculates the second total error on the basis of the second current value and the second error information included in the charging information acquired from the battery sensor 42 (step S202). The second total error is calculated on the basis of Mathematical expression (1) and Mathematical expression (2).

The comparison unit 108 compares whether the first total error is greater than the second total error (step S203). When the first total error is greater than the second total error (step S203: YES), the selection unit 109 selects the second current value as a current value output to the deterioration estimation unit 105. The charging information selection unit 104 outputs charging information including the second current value to the deterioration estimation unit 105 (step S204). When the first total error is equal to or less than the second total error (step S203: NO), the selection unit 109 selects the first current value as a current value output to the deterioration estimation unit 105. The charging information selection unit 104 outputs charging information including the first current value to the deterioration estimation unit 105 (step S205).

According to the first embodiment described above, in the communication unit 101 of the diagnostic device 100, charging information is acquired from the external charger 200 and the vehicle 10 through the network 300. The charging information includes a current value detected by the external charger 200 or the vehicle 10, error information held by the external charger 200 or the vehicle 10, and a time at which the current value is detected. The charging information selection unit 104 selects a current value to be used to estimate a deterioration degree of the battery 40 between the current values detected by the external charger 200 and the vehicle 10. The charging information selection unit 104 selects a current value having few errors. The charging information selection unit 104 records charging information including the selected current value in the storage unit 102. The deterioration estimation unit 105 estimates a deterioration degree of the battery 40 by integrating the current value included in the charging information recorded in the storage unit 102. In this manner, the deterioration estimation unit 105 estimates a deterioration degree using a current value having few errors in response to a time at which the current value is detected from current values detected by the external charger 200 and current values detected by the vehicle 10. Accordingly, it is possible to estimate a deterioration degree of the battery 40 with higher accuracy.

Figure 10A:
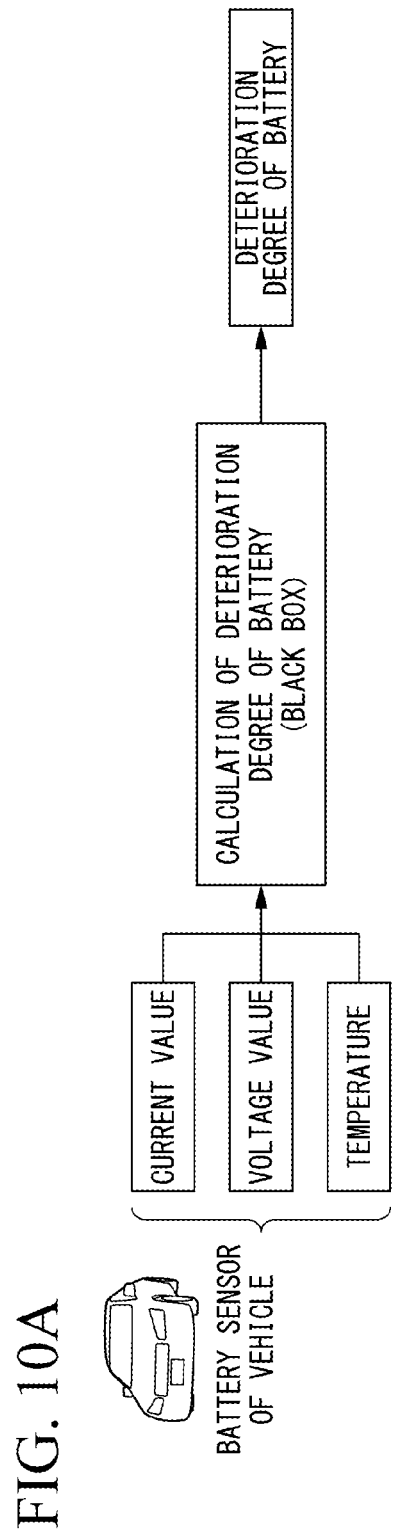
FIG. 10A is a schematic diagram illustrating an overview of conventional estimation of a deterioration degree of a battery 40.

In addition, it is possible to promote visualization of a deterioration degree of the battery 40 by using a deterioration degree estimation means of the battery 40 in the first embodiment. FIG. 10A is a schematic diagram illustrating an overview of conventional estimation of a deterioration degree of the battery 40. Referring to FIG. 10A, in a conventional method, a current value, a voltage value, and a temperature are detected by a battery sensor 42 mounted in a vehicle. However, a conventional deterioration degree calculation method is configured as a black box. Accordingly, a calculated deterioration degree of the battery 40 has a standard varying with a method.

Figure 10B:
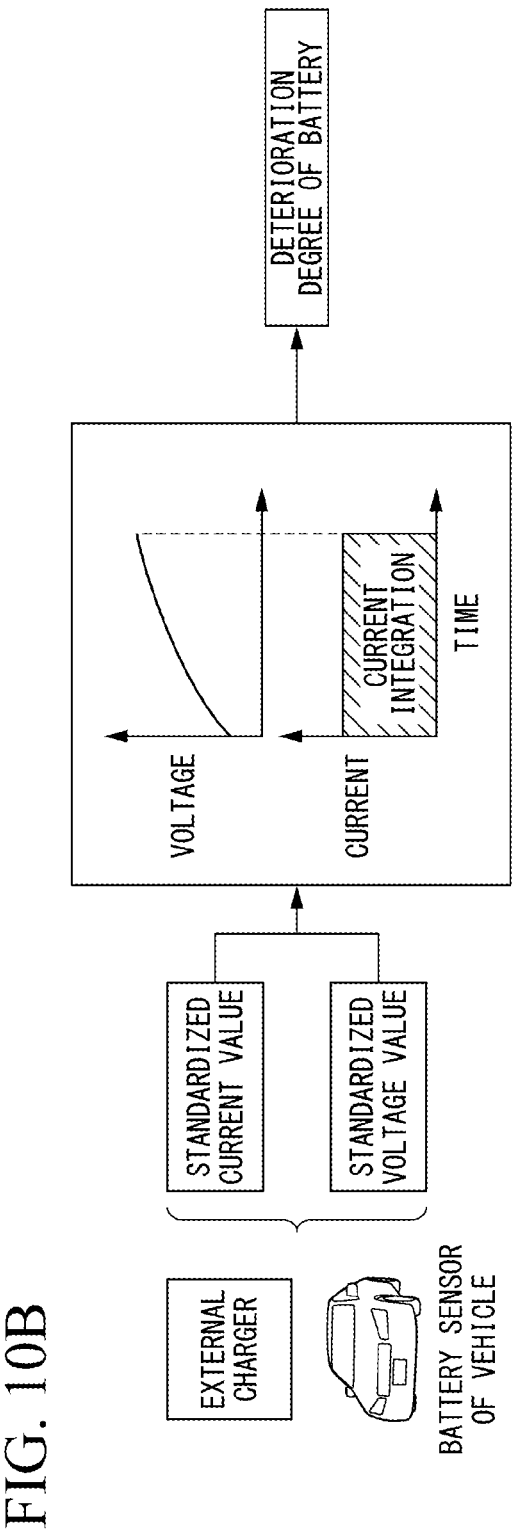
FIG. 10B is a schematic diagram illustrating an overview of estimation of a deterioration degree of a battery 40 of the first embodiment.

FIG. 10B is a schematic diagram illustrating an overview of estimation of a deterioration degree of the battery 40 of the first embodiment. As an example, FIG. 10B represents a schematic diagram when sensors mounted in the external charger 200 and the vehicle 10 have been standardized. When current sensors mounted in the external charger 200 and the vehicle 10 have been standardized, a detected current value is a standardized current value. When voltage sensors mounted in the external charger 200 and the vehicle 10 have been standardized, a detected voltage value is a standardized voltage value. In the first embodiment, the deterioration estimation unit 105 estimates a deterioration degree of the battery 40 by integrating a detected current value. In this manner, unification of standards of a deterioration degree of the battery 40 is promoted by clarifying a battery deterioration degree estimation method. Accordingly, it is possible to improve the reliability of a user with respect to a deterioration degree of the battery 40. In addition, since depreciation of the battery 40 is easily determined, a price of a used battery in a second-hand market is also easily calculated. Furthermore, since the external charger 200 and the vehicle 10 are existing facilities, it is possible to clarify a method of estimating a deterioration degree of the battery 40 without additional investment.

Second Embodiment

Figure 11:
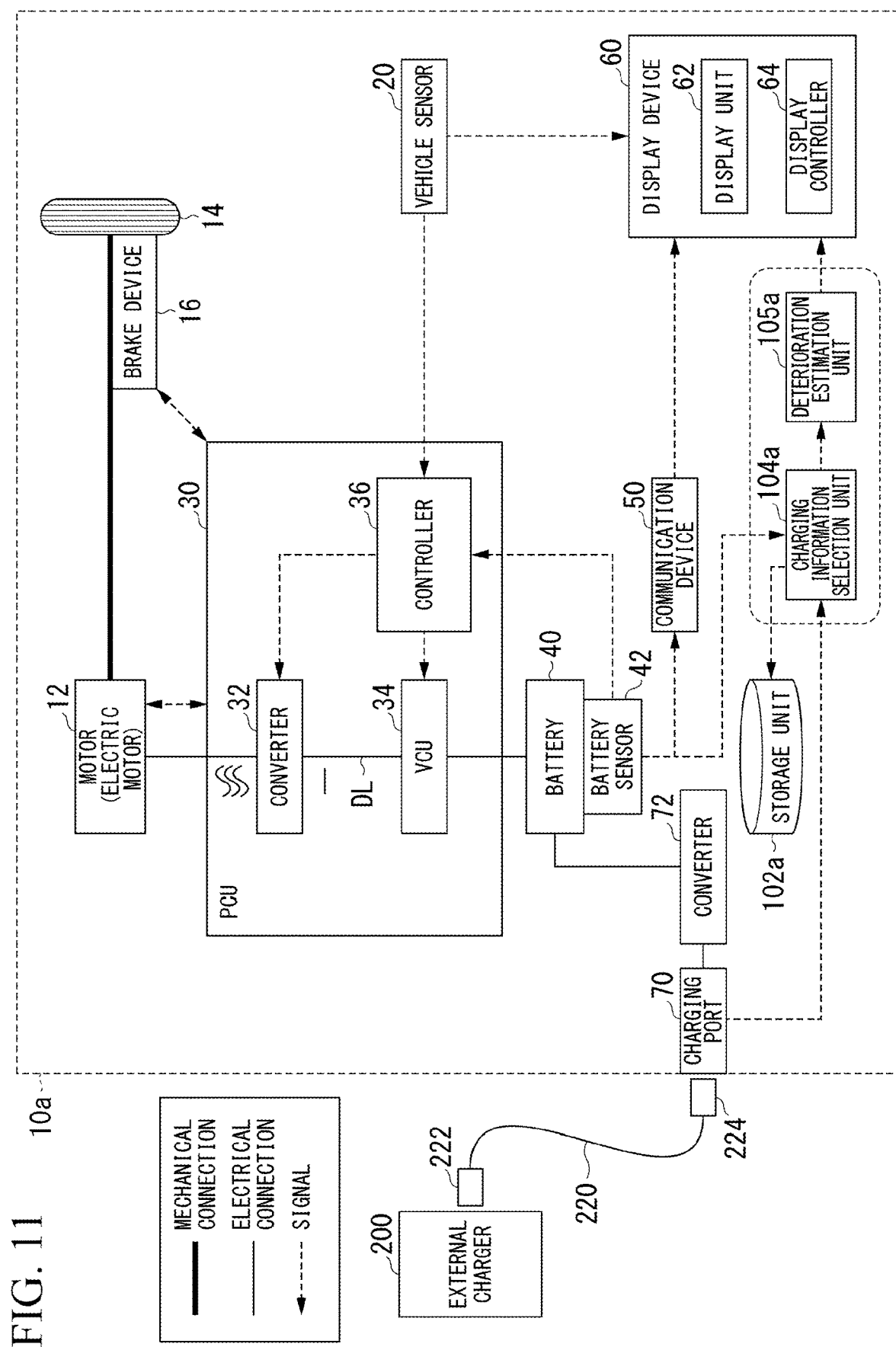
FIG. 11 is a diagram illustrating an example of a configuration of a vehicle 10a according to a second embodiment.

Next, a second embodiment will be described. FIG. 11 is a diagram illustrating an example of a configuration of a vehicle 10*a* according to the second embodiment. The configuration of the second embodiment differs from the configuration of the first embodiment in that components having the same functions as the storage unit 102, the charging information selection unit 104, and the deterioration estimation unit 105 provided in the diagnostic device 100 are provided in the vehicle 10*a* as a storage unit 102*a*, a charging information selection unit 104*a*, and a deterioration estimation unit 105*a*. The configuration of the second embodiment and the configuration of the first embodiment are otherwise approximately common. Hereinafter, description will focus on differences from the first embodiment in processing in the second embodiment.

The vehicle 10*a* differs from the first embodiment in that the vehicle 10*a* outputs charging information to the charging information selection unit 104*a* instead of transmitting the charging information to the diagnostic device 100. In addition, the vehicle 10*a* differs from the first embodiment in that the vehicle 10*a* acquires charging information detected by the external charger 200 from the charging port 70.

The storage unit 102*a* is configured using a storage device such as a magnetic hard disk device or a semiconductor storage device. The storage unit 102*a* stores charging information. The charging information recorded in the storage unit 102*a* is used to estimate a deterioration degree of the battery 40.

The charging information selection unit 104*a* acquires charging information from the battery sensor 42. The charging information selection unit 104*a* acquires charging information detected by the external charger 200 from the charging port 70. The charging information selection unit 104*a* selects charging information used to estimate a deterioration degree of the battery 40 from the charging information acquired from the battery sensor 42 and the charging information acquired from the external charger 200. The charging information selection unit 104*a* records the selected charging information in the storage unit 102*a*. Detailed processing in the charging information selection unit 104*a* is the same as that in the charging information selection unit 104 and thus description thereof is omitted.

The deterioration estimation unit 105*a* estimates a deterioration degree of the battery 40. Specifically, the deterioration estimation unit 105*a* estimates a deterioration degree of the battery 40 using a known method for one or more pieces of charging information recorded in the storage unit 102*a*. A deterioration degree of the battery 40 may be, for example, a battery capacity. The known method used by the deterioration estimation unit 105*a* may be, for example, a current integration method.

Figure 12:
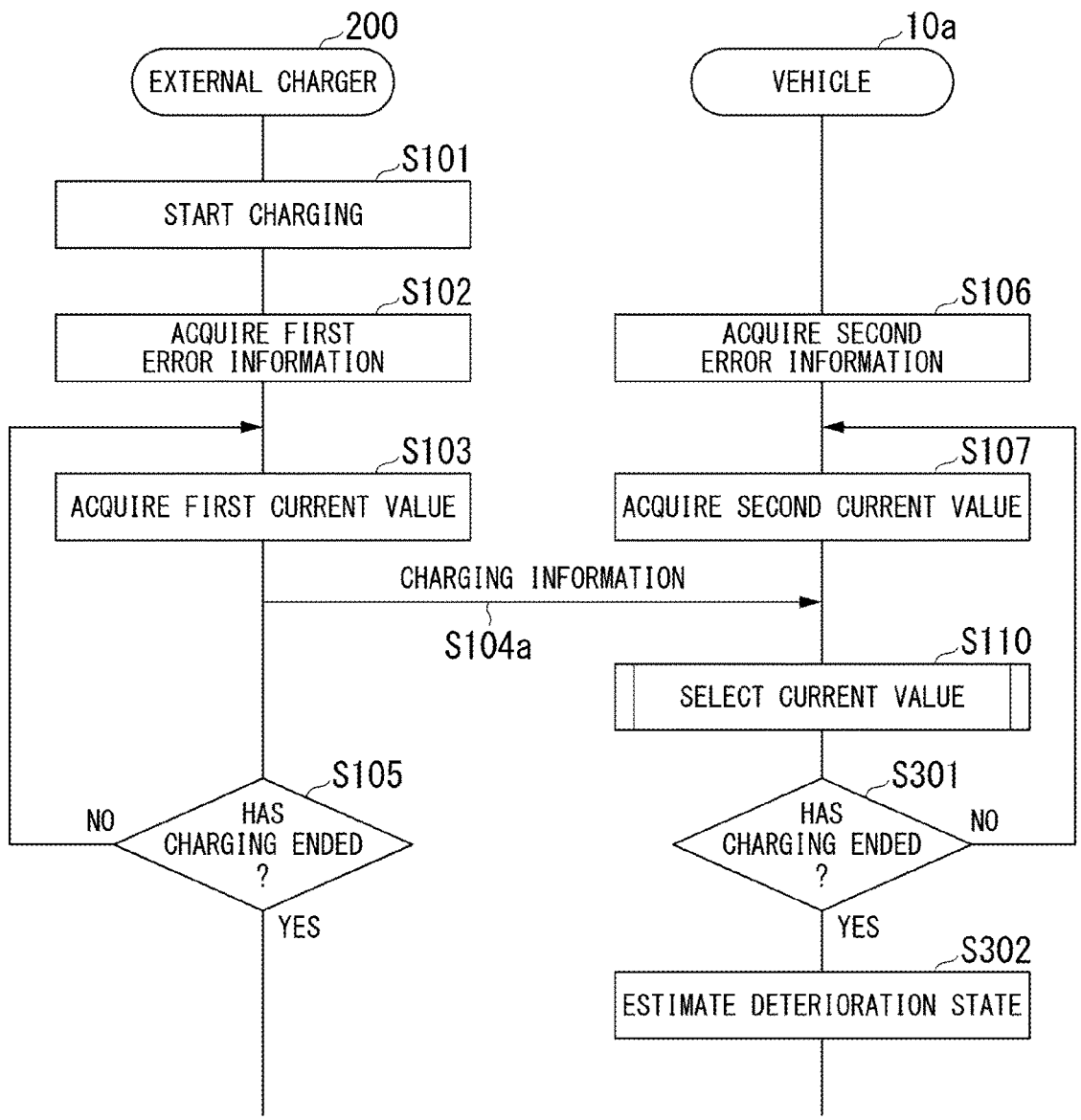
FIG. 12 is a sequence chart illustrating a flow of processing of estimating a deterioration degree according to the second embodiment.

FIG. 12 is a sequence chart illustrating a flow of processing of estimating a deterioration degree according to the second embodiment. In FIG. 12, it is assumed that charging information includes a current value. Meanwhile, step S102, step S103 and step S105 are performed in parallel with step S106, step S107 and step S109. Step S106 starts after step S101 is performed. Meanwhile, step S101 to step S103, step S105 to step S107, and step S110 are the same as those in the first embodiment and thus description thereof is omitted.

The charging sensor 202 transmits charging information including the first error information, the first current value, and a time at which the first current value is detected to the vehicle 10*a* through the charging port 201 (step S104*a*). The charging port 70 outputs the charging information transmitted from the charging sensor 202 to the charging information selection unit 104*a*.

The battery sensor 42 determines whether charging has ended (step S301). Whether charging has ended may be determined, for example, by determining whether the second plug 224 has been separated from the charging port 70 or determining whether a charge rate of the battery 40 has reached a predetermined threshold value (e.g., 95%) or more. When charging has ended (step S301: YES), the deterioration estimation unit 105 estimates a deterioration degree of the battery 40 (step S302). When charging has not ended (step S301: NO), processing proceeds to step S107.

According to the second embodiment described above, the charging information selection unit 104*a* selects a current value to be used to estimate a deterioration degree of the battery 40 between the current values detected by the external charger 200 and the vehicle 10*a* as in the first embodiment. The charging information selection unit 104*a* selects a current value having few errors. The charging information selection unit 104*a* records charging information including the selected current value in the storage unit 102*a*. The deterioration estimation unit 105*a* estimates a deterioration degree of the battery 40 by integrating the current value included in the charging information recorded in the storage unit 102*a*. In this manner, the deterioration estimation unit 105*a* estimates a deterioration degree using a current value having few errors in response to a time at which the current value is detected from the current value detected by the external charger 200 and the current value detected by the vehicle 10*a*. Accordingly, it is possible to estimate a deterioration degree of the battery 40 with higher accuracy.

MODIFIED EXAMPLES

In the above-described embodiments, the diagnostic device 100 or the vehicle 10 estimates a deterioration degree of the battery 40. However, a deterioration degree of the battery 40 may be estimated by a device other than the diagnostic device 100 or the vehicle 10. For example, an information terminal (e.g., an information processing device such as a smartphone or a tablet computer) carried by a user of the vehicle 10 may be configured to estimate a deterioration degree of the battery 40. In this case, the information terminal includes a storage unit, a sensor selection unit, and a deterioration estimation unit. The information terminal transmits a deterioration degree of the battery 40 to the vehicle 10.

In addition, the external charger 200 may estimate a deterioration degree of the battery 40. In this case, the external charger 200 includes a storage unit, a sensor selection unit, and a deterioration estimation unit. The external charger 200 may transmit a deterioration degree of the battery 40 to the vehicle 10 or display the deterioration degree of the battery 40 on a display device (not shown) included in the external charger 200.

Meanwhile, in a case where the external charger 200 estimates a deterioration degree of the battery 40, the external charger 200 may receive input of a predetermined code from a user. The predetermined code may be, for example, a code number predetermined by the user or a physical medium such as an IC card or a key. The external charger 200 may acquire user information from the vehicle 10 when the predetermined code is input. The user information may be, for example, a mileage of the vehicle 10, initial SOC information of the battery 40 or a discharging/charging history with respect to the vehicle 10. The external charger 200 may perform constant-current charging on the basis of the acquired user information. The external charger 200 can estimate a deterioration degree of the battery 40 with higher accuracy by performing constant-current charging.

Although the deterioration estimation unit 105 estimates a deterioration degree of the battery 40 by integrating a current value in the above-described embodiments, the present invention is not limited thereto. For example, the deterioration estimation unit 105 may estimate a deterioration degree of the battery 40 on the basis of a voltage value or a temperature.

Although the display device 60 causes the display unit 62 of the vehicle 10 to display a deterioration degree of the battery 40 received by the communication device 50 in the above-described embodiments, other objects may be caused to display the deterioration degree of the battery 40. For example, a display controller of the external charger 200 may be configured to display a deterioration degree of the battery 40 on a display device (not shown) included in the external charger 200 instead of or in addition to a configuration in which the display controller 64 of the display device 60 in the vehicle 10 causes the display unit 62 to display the deterioration degree of the battery 40. Alternatively, an information terminal (e.g., an information processing device such as a smartphone or a tablet computer) carried by the user of the vehicle 10 may be configured to display the deterioration degree of the battery 40.

Although the diagnostic device 100 is one device in the above-described embodiments, the diagnostic device 100 may be composed of a plurality of devices. The diagnostic device 100 may be configured by a cloud computing system.

Although forms for embodying the present invention have been described using embodiments, the present invention is not limited to the embodiments and various modifications and substitutions are possible without departing from essential characteristics of the present invention.

REFERENCE SIGNS LIST

1 Diagnostic system
10 Vehicle
12 Motor
40 Battery
42 Battery sensor
50 Communication device
60 Display device
62 Display unit
64 Display controller
70 Charging port
72 Converter
100 Diagnostic device
101 Communication unit (acquisition unit)
102, 102a Storage unit
103 Controller
104, 104a Charging information selection unit
105, 105a Deterioration estimation unit
200 External charger
201 Charging port
202 Charging sensor
203 Communication unit
220 Charging cable
222 First plug
224 Second plug
300 Network
M1 Battery charge rate meter
T1 Deterioration degree of battery

What is claimed is:

1. A diagnostic device comprising:
an acquisition unit configured to acquire first charging information including a first detected value detected by an external charger during charging of a battery mounted in a vehicle and second charging information including a second detected value detected by the vehicle during charging of the battery; and
a deterioration estimation unit configured to estimate a deterioration degree indicating a degree of deterioration of the battery on the basis of the first charging information and the second charging information,
wherein the deterioration estimation unit estimates the deterioration degree indicating the degree of deterioration of the battery while switching between the first charging information and the second charging information,
wherein the first charging information further includes first error information representing error characteristics of the first detected value, and
the second charging information further includes second error information representing error characteristics of the second detected value,
the diagnostic device further comprises an error calculation unit configured to calculate a first error representing an error in the first detected value on the basis of the first detected value and the first error information and calculate a second error representing an error in the second detected value on the basis of the second detected value and the second error information, and
wherein the deterioration estimation unit estimates the deterioration degree on the basis of the first error and the second error.

2. The diagnostic device according to claim 1, further comprising a comparison unit configured to compare the first error with the second error,
wherein the deterioration estimation unit estimates the deterioration degree on the basis of a result of the comparison.

3. The diagnostic device according to claim 2, wherein the deterioration estimation unit integrates the second detected value in a period in which the first error is greater than the second error, integrates the first detected value in a period in which the first error is equal to or less than the second error, and estimates a deterioration degree by combining the integrated first detected value and second detected value.

4. The diagnostic device according to claim 1, further comprising a display unit configured to display the deterioration degree.

5. The diagnostic device according to claim 1, wherein the first detected value and the second detected value are current values.

6. The diagnostic device according to claim 5, wherein the deterioration estimation unit estimates the deterioration degree by integrating the first detected value or the second detected value.

7. A diagnostic system comprising:
the diagnostic device according to claim 1; and
an external charger configured to communicate with the diagnostic device and transmit first charging information including a first detected value detected during charging of a battery mounted in a vehicle to the diagnostic device.

8. A diagnostic method executed using a computer, comprising:
acquiring first charging information including a first detected value detected by an external charger during charging of a battery mounted in a vehicle and second charging information including a second detected value detected by the vehicle during charging of the battery;
estimating a deterioration degree indicating a degree of deterioration of the battery on the basis of the first charging information and the second charging information;
estimating the deterioration degree indicating the degree of deterioration of the battery while switching between the first charging information and the second charging information,
wherein the first charging information further includes first error information representing error characteristics of the first detected value, and
the second charging information further includes second error information representing error characteristics of the second detected value; and
calculating a first error representing an error in the first detected value on the basis of the first detected value and the first error information and calculating a second error representing an error in the second detected value on the basis of the second detected value and the second error information,
wherein the the deterioration degree is further estimated on the basis of the first error and the second error.

9. A non-transitory computer storage medium storing a program causing a computer to:
acquire first charging information including a first detected value detected by an external charger during charging of a battery mounted in a vehicle and second charging information including a second detected value detected by the vehicle during charging of the battery;
estimate a deterioration degree indicating a degree of deterioration of the battery on the basis of the first charging information and the second charging information;
estimate the deterioration degree indicating the degree of deterioration of the battery while switching between the first charging information and the second charging information,
wherein the first charging information further includes first error information representing error characteristics of the first detected value, and
the second charging information further includes second error information representing error characteristics of the second detected value; and
calculate a first error representing an error in the first detected value on the basis of the first detected value and the first error information and calculate a second error representing an error in the second detected value on the basis of the second detected value and the second error information,
wherein the deterioration degree is further estimated on the basis of the first error and the second error.

* * * * *